(12) United States Patent
Adams et al.

(10) Patent No.: US 7,239,559 B2
(45) Date of Patent: Jul. 3, 2007

(54) METHODS AND APPARATUS FOR ACCESSING MEMORY

(75) Inventors: Chad A. Adams, Byron, MN (US); Anthony G. Aipperspach, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 134 days.

(21) Appl. No.: 11/122,805

(22) Filed: May 5, 2005

(65) Prior Publication Data
US 2006/0250842 A1 Nov. 9, 2006

(51) Int. Cl.
*G11C 7/00* (2006.01)
*G11C 8/00* (2006.01)
(52) U.S. Cl. .................. 365/189.01; 365/154; 365/222; 365/233
(58) Field of Classification Search ............... 365/154, 365/222, 233, 189.01
See application file for complete search history.

(56) References Cited

U.S. PATENT DOCUMENTS

| | | | |
|---|---|---|---|
| 6,301,174 B1 * | 10/2001 | Chung | 365/203 |
| 6,430,073 B1 * | 8/2002 | Batson et al. | 365/49 |
| 6,704,234 B2 * | 3/2004 | Mizugaki | 365/222 |

* cited by examiner

*Primary Examiner*—Son Dinh
(74) *Attorney, Agent, or Firm*—Dugan & Dugan (57) ABSTRACT

In a first aspect, a first method is provided for accessing memory. The first method includes the steps of (1) storing a bit in a cell included in a memory having a plurality of cells arranged into rows and columns, wherein each cell includes a first group of transistors adapted to store the bit and a second group of transistors adapted to affect a signal asserted during a read operation on a read bit line coupled to the cell such that the affected signal matches a value of the bit stored in the cell; and (2) preventing the value of the bit stored in the cell from changing state while the second group of transistors affects the signal asserted during the read operation on the read bit line coupled to the cell. Numerous other aspects are provided.

20 Claims, 7 Drawing Sheets

METHODS AND APPARATUS FOR ACCESSING MEMORY

FIELD OF THE INVENTION

The present invention relates generally to computer systems, and more particularly to methods and apparatus for accessing memory in a computer system.

BACKGROUND

A memory may include a plurality of static random access memory (SRAM) cells arranged in columns and rows. Each SRAM cell may store a bit of data. To read a value stored in a cell or write a value into a cell, a column including the cell may be selected, and thereafter, a row including the cell may be selected.

An SRAM cell of a conventional memory may include transistors employed to store a value in the cell. The transistors may also be employed to affect a state of a signal coupled to the cell when a column that includes the cell is selected, such as for a read operation (e.g., the transistors may pull down the signal from a high logic state to a low logic state). However, employing such transistors to affect the state of the signal may cause the value stored in the cell to inadvertently change state (e.g., to be disturbed).

To read or write to a cell included in the conventional memory, a column of cells are selected, and thereafter, a row including the cell to be read or written is selected. However, because respective rows of remaining cells in the column are not selected, such remaining cells undergo stress which may cause respective values stored in such cells to inadvertently change state.

Accordingly, improved methods and apparatus are desired for accessing such a memory.

SUMMARY OF THE INVENTION

In a first aspect of the invention, a first method is provided for accessing memory. The first method includes the steps of (1) storing a bit in a cell included in a memory having a plurality of cells arranged into rows and columns, wherein each cell includes a first group of transistors adapted to store the bit and a second group of transistors adapted to affect a signal asserted during a read operation on a read bit line coupled to the cell such that the affected signal matches a value of the bit stored in the cell; and (2) preventing the value of the bit stored in the cell from changing state while the second group of transistors affects the signal asserted during the read operation on the read bit line coupled to the cell.

In a second aspect of the invention, a second method is provided for accessing memory. The second method includes the steps of (1) selecting a column of a memory having a plurality of cells arranged into rows and columns, wherein the selected column includes a first cell to be written; (2) writing new data to the first cell; and (3) while writing data to the first cell, refreshing data in a second cell in the selected column.

In a third aspect of the invention, a first apparatus is provided. The first apparatus is a memory cell having (1) a first group of transistors; and (2) a second group of transistors, coupled to the first group of transistors, and adapted to affect a signal asserted during a read operation on a read bit line coupled to the cell such that the affected signal matches a value of a bit stored in the cell. The memory cell is adapted to (a) store a bit in the cell using the first group of transistors; and (b) prevent the value of the bit stored in the cell from changing state while the second group of transistors affects the signal asserted during the read operation on the read bit line coupled to the cell.

In a fourth aspect of the invention, a second apparatus is provided. The second apparatus includes (1) a memory having a plurality of cells arranged into rows and columns; and (2) data input/output logic coupled to the memory and adapted to at least one of input data to and output data from the memory. The memory is adapted to (a) select a column of cells, wherein the selected column includes a first cell to be written; (b) write new data to the first cell; and (c) while writing data to the first cell, refresh data in a second cell in the selected column. Numerous other aspects are provided in accordance with these and other aspects of the invention.

Other features and aspects of the present invention will become more fully apparent from the following detailed description, the appended claims and the accompanying drawings.

DETAILED DESCRIPTION

In a first aspect, the present invention provides methods and apparatus for preventing a value stored in an SRAM cell from inadvertently changing state during a read operation. More specifically, the present invention provides an SRAM cell including transistors (e.g., eight transistors) arranged such that transistors employed to store a value in the cell need not be employed to affect a state of a signal coupled to the cell when a column including the cell is selected for a read operation.

In a second aspect, the present invention provides methods and apparatus for preventing a value stored in an SRAM cell from inadvertently changing state during a write operation. More specifically, the present invention provides a memory including a plurality of SRAM cells arranged in columns and rows. Each SRAM cell may include transistors (e.g., eight transistors) arranged as described above in the first aspect. To write to a cell included in the memory in accordance with the second aspect, a column of cells may be selected, and thereafter, a row including the cell to be written may be selected. However, in contrast to a conventional memory, the second aspect of the present invention avoids placing stress on remaining cells in the selected column by reading respective data from cells in the column during a first portion of a cycle. Thereafter, during a second portion of the cycle, new data may be stored in the cell to be written, and data read from the remaining cells in the first portion of the cycle may be written back to the remaining cells, respectively, thereby reinforcing the state of such remaining cells. In this manner, the remaining cells are not stressed in a manner which may cause values stored in such cells to inadvertently change state.

Figure 1:
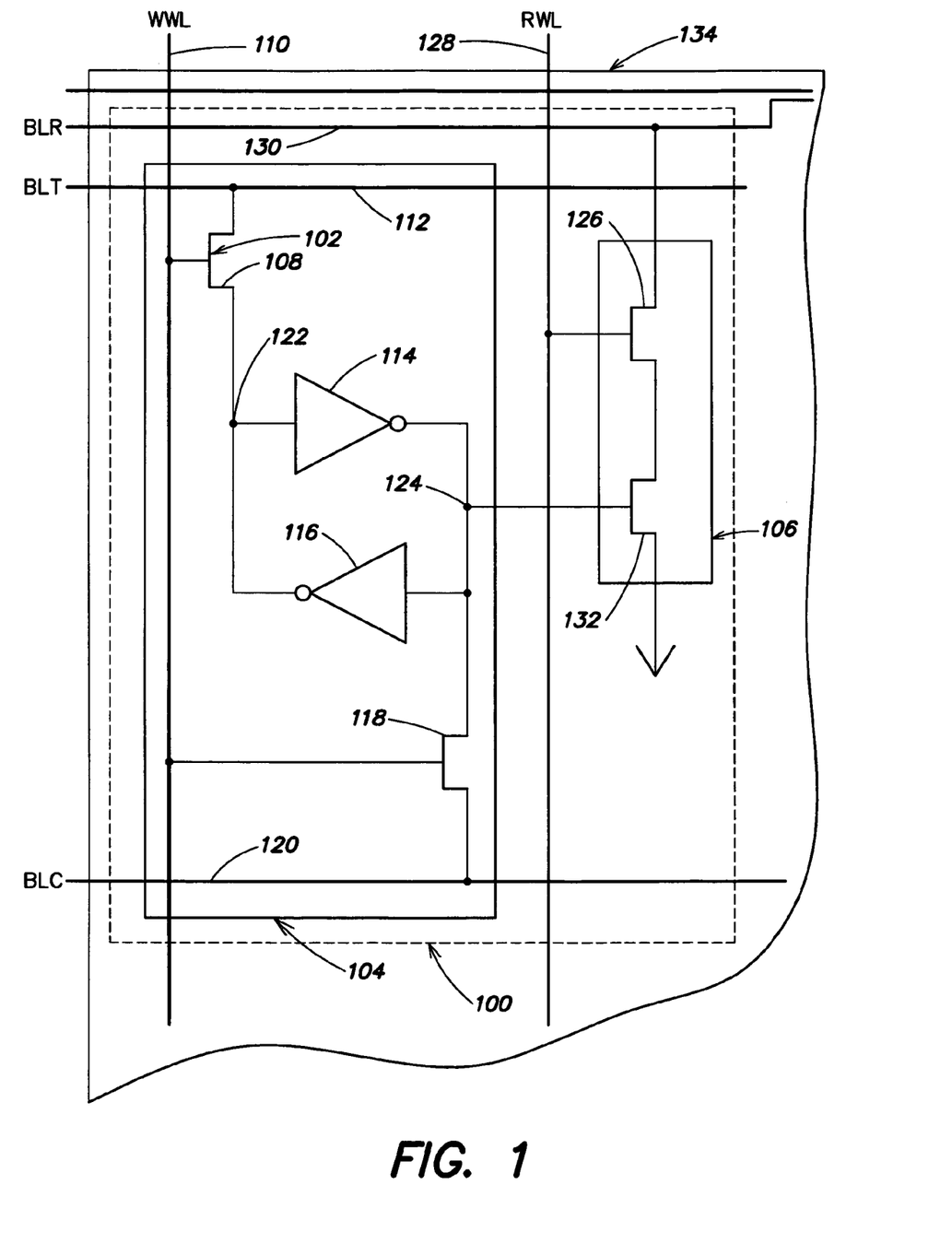
FIG. 1 is a block diagram of a memory cell in accordance with an embodiment of the present invention.

FIG. 1 is a block diagram of a memory cell in accordance with an embodiment of the present invention. With reference to FIG. 1, the memory cell 100 may include a plurality of transistors 102. A first group 104 of the plurality of transistors 102 may be employed for storing data in the cell 100. A second group 106 of the plurality of transistors 102 may be employed for affecting a signal coupled to the second group 106 of the plurality of transistors 102. The second group 106 may be mutually exclusive from the first group 104.

More specifically, the first group 104 may include a first transistor 108 (e.g., an NFET) coupled (e.g., via a gate terminal) to a first word line (e.g., a write word line (WWL)) 110 such that the first word line 110 may serve to activate the first transistor 108. The first transistor 108 may be coupled (e.g., via a drain or source terminal) to a first bit line 112 (e.g., Bit Line True (BLT)), and an input of a first logic device 114, such as an inverter and the output of a second logic device 116, such as an inverter (e.g., via a source or drain terminal of the first transistor 108). Although, the first and second logic devices 114, 116 are shown as inverters, it should be understood that each such inverter may include a pair of coupled transistors (e.g., an NFET coupled with a PFET). The first group 104 may include a second transistor 118, such as an NFET, coupled (e.g., via a gate terminal) to the first word line 110 such that the first word line 110 may serve to activate the second transistor 118. The second transistor 118 may be coupled (e.g., via a source or drain terminal) to a second bit line 120 (e.g., Bit Line Complement (BLC)), and the output of the first logic device 114 and the input of the second logic device 116 (e.g., via a drain or source terminal of the second transistor 118). A voltage of a first node 122 at the input of the first logic device 114 and the output of the second logic device 116 may serve as a value (e.g., of a bit) stored in the cell 100. Alternatively, a voltage at another node included in the first group 104 may serve as the value stored in the cell 100. For example, the voltage of a second node 124 at the output of the first logic device 114 and the input of the second logic device 116 may serve as the value stored in the cell 100. Although the first and second transistors 108, 118 are coupled to the same word line 110, in some embodiments, the first and second transistors 108, 118 may be coupled to different word lines. In this manner, in some embodiments, the first group 104 may include six transistors (although the first group 104 may include a larger or smaller number of and/or different types of transistors).

The second group 106 may include a seventh transistor 126 (e.g., an NFET) of the cell 100 coupled (e.g., via a gate terminal) to a second word line (e.g., a read word line (RWL)) 128 such that the second word line 128 may serve to activate the seventh transistor 126. The seventh transistor 126 may be coupled (e.g., via a drain or source terminal) to a third bit line 130 (e.g., Bit Line Read (BLR)). During a read operation, the second group 106 may cause the value of a signal on the third bit line 130 may track the value stored by the cell 100 (e.g., the value of the first node 122 of the first group 104). Therefore, the third bit line 130 may serve as an output of the cell 100. Details of the operation of the memory cell are described below with reference to FIG. 2.

Further, the second group 106 may include an eighth transistor 132 (e.g., NFET) of the cell 100 coupled to the seventh transistor 126 (e.g., a source or drain terminal of the seventh transistor 126) via a drain or source terminal. The eight transistor 132 may be coupled (e.g., via a source or drain terminal) to a low voltage, such as ground. Additionally, the eight transistor 132 may be coupled (e.g., via a gate terminal) to the second node 124 such that the voltage of the second node 124, which is related to the voltage of the first node 122 that serves as the value stored in the cell 100, may serve to activate the eighth transistor 132. In this manner, the second group 106 may include two transistors 102 (although a larger or smaller number of transistors may be employed). Although the cell 100 includes NFET transistors and logic devices, such as inverters (each of which may include an NFET coupled to a PFET), different types of transistors and/or logic devices may be employed.

The cell 100 may comprise one or more portions of a memory 134. More specifically, although only one cell is shown, the memory 134 may include a plurality of cells 100 arranged into rows and/or columns.

Figure 2:
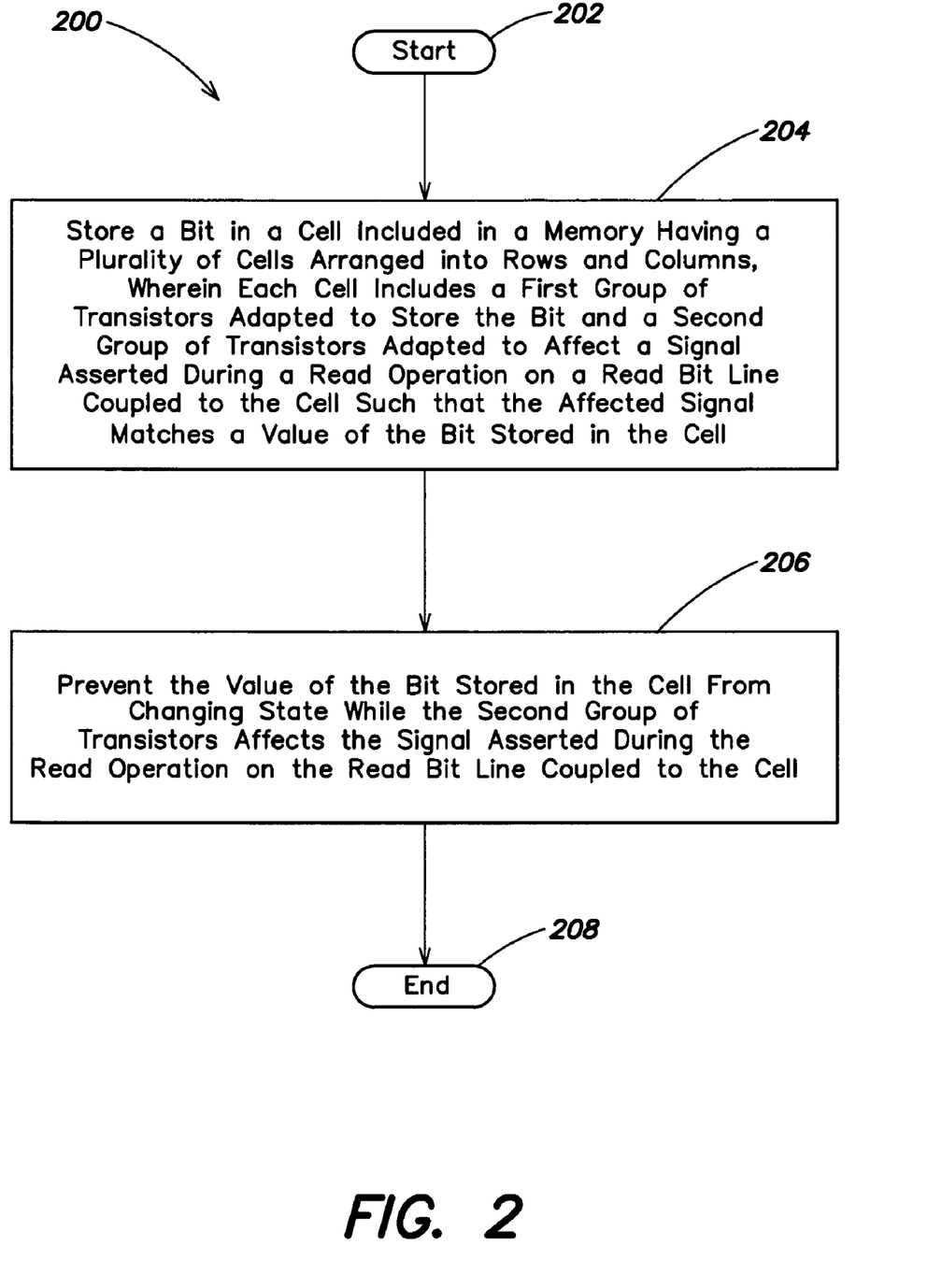
FIG. 2 illustrates a first exemplary method for accessing memory in accordance with an embodiment of the present invention.

FIG. 2 illustrates a first exemplary method for accessing a memory 134 in accordance with an embodiment of the present invention. With reference to FIG. 2, in step 202 the method 200 begins. In step 204, a bit may be stored in a cell 100 included in a memory 134 having a plurality of cells 100 arranged into rows and columns. Each cell 100 may include a first group of transistors adapted to store the bit and a second group of transistors adapted to affect a signal asserted during a read operation on a read bit line coupled to the cell such that the affected signal matches a value of the bit stored in the cell 100. For example, during operation of the memory 134, the first and second bit lines 112, 120 may be charged to opposite logic states. For example, if a bit of a high logic state is to be stored in the cell 100 (e.g., at the first node 122), the first bit line 112 may be of a high logic state, and the second bit line 120 may be of a low logic state. Thereafter, a signal (e.g., of a high logic state) may be asserted on the first word line 110 such that the first and second transistors 108, 118 in the first group 104 of transistors are activated. Consequently, a signal of a high logic state may be stored in the cell 100. Thereafter, the signal on the first word line 110 may be deasserted.

Alternatively, if a bit of a low logic state is to be stored in the cell 100, the first bit line 112 may be of a low logic state and the second bit line 120 may be of a high logic state before the signal is asserted on the first word line 110. Consequently, when the signal is asserted on the first word line 110, a signal of a low logic state may be stored in the cell 100. Thereafter, the signal on the first word line 110 may be deasserted. In this manner, data (e.g., a bit) may be stored in the memory cell 100.

In step 206, the value of the bit stored in the cell is prevented from changing state while the second group of transistors affects the signal asserted during the read operation on the read bit line coupled to the cell. More specifically, to read data (e.g., a bit) stored in the cell 100, a signal (e.g., of a high logic state) may be asserted on the second word line 128 (e.g., RWL) such that the seventh transistor 126 is activated. If the cell 100 stores a bit of a high logic state, the voltage of the second node 124, and therefore, the voltage applied to the gate terminal of the eighth transistor 132 is of a low logic state. Consequently, the eighth transistor 132 is not activated. Therefore, the signal on the third bit line 130, which initially may be charged to a high logic state remains at a high logic state (although the third bit line may initially be charged to a different state).

Alternatively, if the cell 100 stores a bit of a low logic state, the voltage of the second node 124, and therefore, the voltage applied to the gate terminal of the eighth transistor 132 if of a high logic state. Consequently, the eighth transistor 132 is activated. Therefore, because both the seventh and eighth transistors 126, 132 are activated, the second group 106 of transistors affects the signal on the third bit line 130. More specifically, the second group 106 of transistors may change (e.g., force) the signal on the third bit line 130, which initially may be charged to a high logic state, to a low logic state (e.g., ground).

In this manner, the signal on the third bit line 130 may track the value of the bit stored in the cell 100, thereby serving as an output of the cell 100. During a read operation on some conventional memories, transistors which are employed to store a bit in a cell of the conventional memory are also employed to affect a signal on a read bit line coupled thereto. Employing such transistors of a conventional memory to affect the state of the signal may cause the value stored in the cell to inadvertently change state (e.g., to be disturbed). In contrast, the memory of the present methods and apparatus employs cells 100 in which a first group 104 of transistors is employed to store a bit, and a second group 106 of transistors is employed to affect a signal on a read bit line. Consequently, while the second group 106 of transistors affects the signal on the read bit line 130, voltages of nodes formed by the first group 104 of transistors remain unaffected.

Thereafter, step 208 is performed. In step 208, the method 200 ends. Through use of the first exemplary method 200 inadvertent state changes of cells 100 in memory 134 may be reduced and/or prevented during a read operation.

Figure 3A:
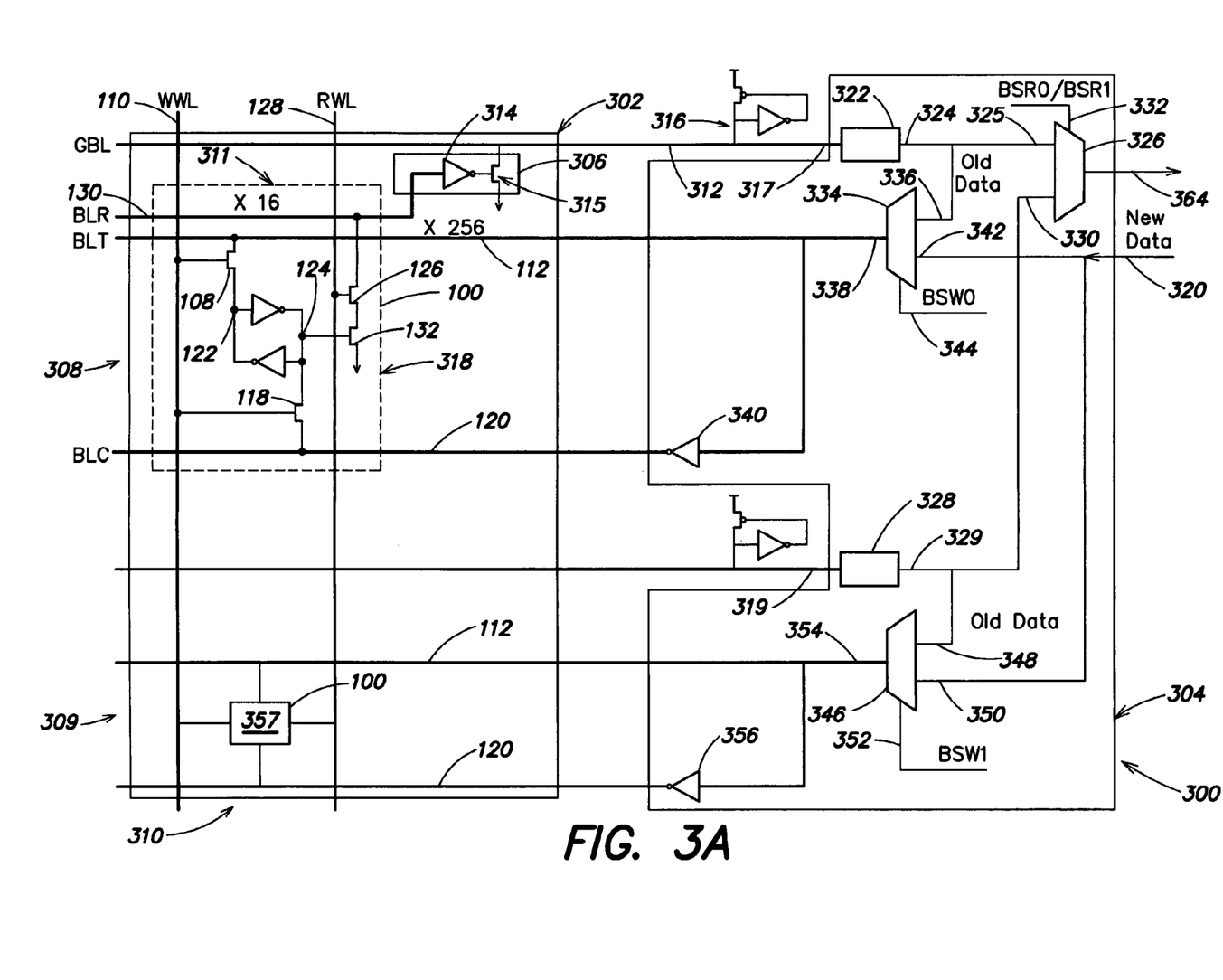
FIG. 3A is a block diagram of a memory system in accordance with an embodiment of the present invention.
Figure 3B:
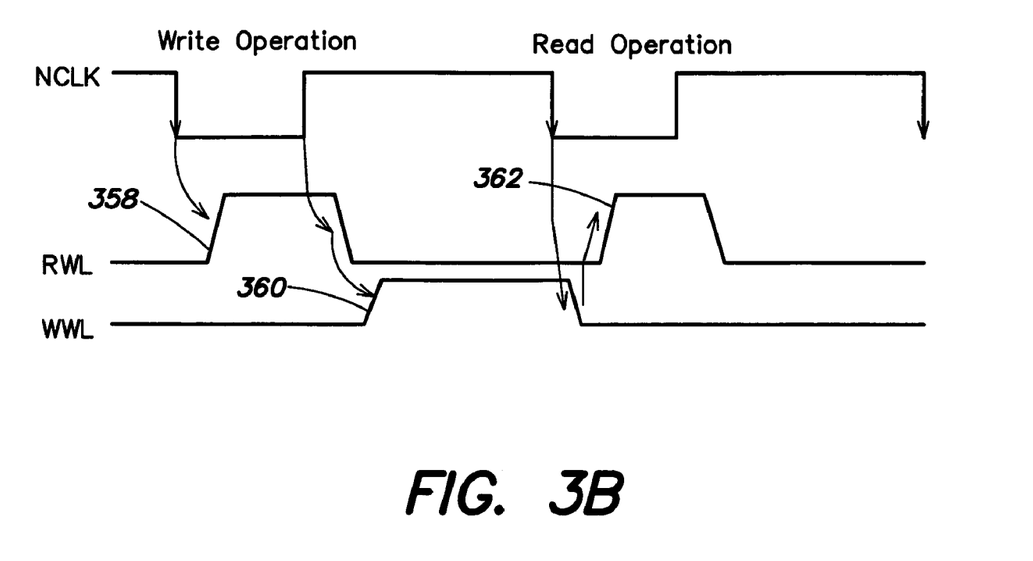
FIG. 3B is a timing diagram illustrating signals applied to the memory system in accordance with an embodiment of the present invention.

FIG. 3A is a block diagram of a memory system in accordance with an embodiment of the present invention and FIG. 3B is a timing diagram illustrating signals applied to the memory system in accordance with an embodiment of the present invention. With reference to FIGS. 3A and 3B, the memory system 300 may include a memory 302 coupled to data input/output logic 304. Further, the memory 302 may include and/or be coupled to evaluation logic 306. The data input/output logic 304 and/or the evaluation logic 306 may be implemented, for example, via combinational, and/or sequential logic or as an application specific integrated circuit (ASIC). The memory 302 may include a plurality of cells 100 described with reference to FIG. 1. The cells 100 may be arranged in one or more rows 308, 309 and/or columns 310, each of which may include a plurality of cells 100. The plurality of cells may be coupled in a domino arrangement. For example, in one embodiment, each row 308, 309 of the memory 302 may include sixteen groups 311 (only one shown) of cells 100 each of which includes sixteen cells 100. In this manner, each row 308, 309 of the memory 302 may include 256 cells 100. However, the cells 100 of the memory 302 may be arranged in a different manner. For example, the cells 100 may be arranged into a larger or smaller number of rows 308, 309 and/or columns 310.

Each group 311 of sixteen cells 100 may be coupled to respective dedicated third bit lines (e.g., BLR) 130. However, cells 100 of the memory 302 may be coupled to the same first, second and/or global bit lines 112, 120, 312 (see below).

As stated, a value of a signal on the third bit line 130 that may be coupled to a cell 100 may serve as an output of the cell 100. The third bit line 130 may be coupled to an input of the evaluation logic 306. The evaluation logic 306 may also be coupled to a global bit line 312. More specifically, the evaluation logic 306 may include a logic device 314, such as an inverter, the input of which may be coupled to the third bit line 130. The output of the logic device 314 may be coupled to a gate terminal of a transistor 315, which is coupled (e.g., via a source or drain terminal) to the global bit line 312 and is coupled (e.g., via a drain or source terminal) to a low logic state, such as ground. However, the evaluation logic 306 may be configured differently. Further, in some embodiments, the memory system 300 may include feedback logic 316 coupled to the global bit line 312 and adapted to maintain a voltage thereof.

The evaluation logic 306 may be adapted to affect a signal on the global bit line 312 such that the signal tracks a value of a signal on the third bit line 130. In this manner, the value of the global bit line 312 may serve as an output of the memory 302. Additionally, the evaluation logic 306 may be adapted to initially charge (e.g., pre-charge) a signal on the third bit line 130 coupled to the cell 100 to a value. The output of the evaluation logic 306 may be coupled to a first input 317 of the data input/output logic 304.

Although a first row 308 of the memory 302 including a first cell 318 is described above, a second row 309 of the memory 302 may be configured in a similar manner. For example, a cell 357 in the second row 309 may be coupled to second evaluation logic (not shown), the output of which may be coupled to a second input 319 of the data input/output logic 304. Further, the data input/output logic 304 may be adapted to receive data (e.g., new data to be written to a cell 100 (e.g., cell 318) in the memory 302) via a third input 320.

The data input/output logic 304 may include a first latching structure 322 adapted to store and launch data input by the first input 317 (e.g., from a cell 100 in a first row 308). An output 324 of the first latch structure 322 may be coupled to a first multiplexer 326 via a first input 325 thereof. Similarly, the data input/output logic 304 may include a second latching structure 328 adapted to store and launch data input by the second input 319 (e.g., from a cell 100 in a second row 309). An output 329 of the second latching structure 328 may be coupled to the first multiplexer 326 via a second input 330 thereof. The first multiplexer 326 may include additional inputs 332 adapted to receive one or more respective control signals (e.g., BSR0 and BSR1). Based on the control signals, the first multiplexer 326 may output the data input by the first input 325 (e.g., from a cell 100 (e.g., cell 318) in the first row 308) or the second input 330 (e.g., from a cell 100 in the second row 309).

The output 324 of the first latching structure 322 may be coupled to a second multiplexer 334 via a first input 336 thereof. A second input 342 of the second multiplexer 334 may be coupled to and receive the data (e.g., new data) input by the third input 320 of the data input/output logic 304. The second multiplexer 334 may include a third input 344 adapted to receive a control signal (e.g., BSW0). Based on the control signal, the second multiplexer 334 outputs, via an output 338, the data input by the first input 336 (e.g., from a cell 100 (e.g., cell 318) in the first row 308) or the second input 342 (e.g., the new data). The output 338 of the second multiplexer 334 may be coupled to the first bit line 112 for the first row 308, and may be coupled to logic 340 such as an inverter to the second bit line 120 for the first row 308.

Similarly, the output 329 of the second latching structure 328 may be coupled to a third multiplexer 346 via a first input 348 thereof. A second input 350 of the third multiplexer 346 may be coupled to and receive the new data input by the third input 320 of the data input/output logic 304. The third multiplexer 346 may include a third input 352 adapted to receive a control signal (e.g., BSW1). Based on the control signal, the third multiplexer 346 may output, via an output 354, the data input by the first input 348 (e.g., from a cell 100 (e.g., cell 357) in the second row 309) or the second input 350 (e.g., the new data). It should be noted that in some embodiments, BSW1 is asserted when BSW0 is not asserted, and vice versa. The output 354 of the second multiplexer 346 may be coupled to a first bit line 112 for the second row 309, and a second bit line 120 for the second row 309 via second logic 356 such as an inverter.

During a read operation to a cell 100 in a selected column 310, the data input/output logic 304 may be adapted to selectively output data read from one of a plurality of cells 100 (e.g., cells 100 in different rows 308, 309) in the memory 302. In this manner, the data input/output logic 304 may output data from the memory 302 to logic downstream from the data input/output logic 304.

Additionally or alternatively, to perform a write operation to a cell 100 in a selected column 310 and a selected row 308, 309, the data input/output. logic 304 may be adapted to output the new data to the cell 100 (e.g., cell 318) and to output data read from a remaining cell 357 from an unselected row 309 in the selected column 310 (e.g., the second row 309) to the remaining cell 357. In this manner, the data input/output logic 304 may store the new data in a cell 100 (e.g., cell 318) in one row 308, 309 of the selected column 310 and data previously read from a remaining cell 357 in another row 308, 309 of the selected column 310 back into the remaining cell 357. Details of the operation of the data input/output logic 304 are described below with reference to FIG. 4.

Figure 4:
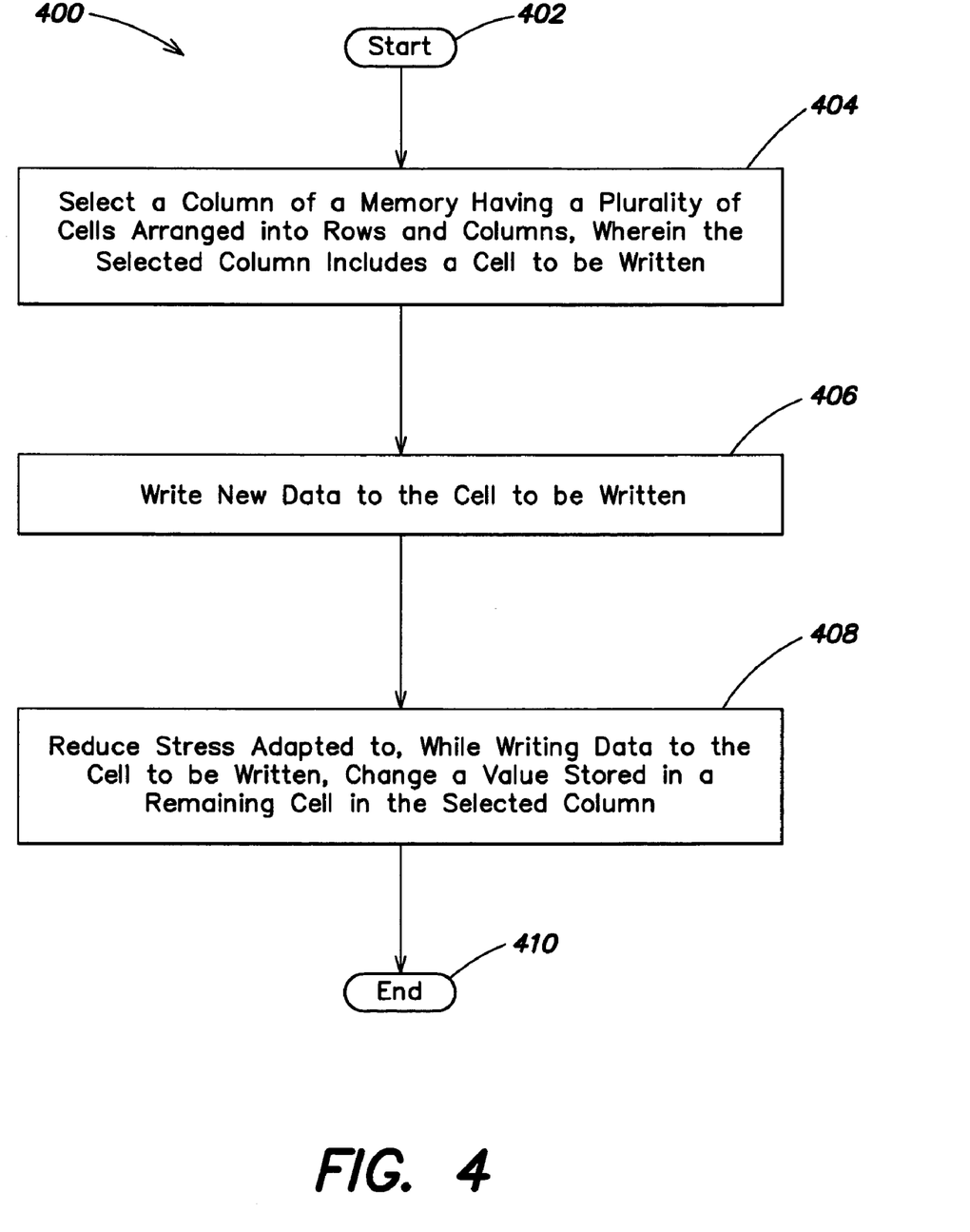
FIG. 4 is illustrates a second exemplary method for accessing memory in accordance with an embodiment of the present invention.

The operation of the memory system 300 is now described with reference to FIGS. 3A and 3B and with reference to FIG. 4 which illustrates a second exemplary method for accessing memory in accordance with an embodiment of the present invention. With reference to FIG. 4, in step 402 the method 400 begins. In step 404, a column of a memory having a plurality of cells arranged into rows and columns may be selected. The selected column may include a cell to be written. During operation, a first and second bit lines 112, 120 of the memory 302 initially may be charged (e.g., pre-charged) to a high logic state. Similarly, each of the global bit lines 312 and third bit lines 130 coupled to one or more cells 100 of the memory 302 initially may be charged to a high logic state. However, in some embodiments, the first, second, third and/or global bit lines 112, 120, 130, 312 initially may be charged to a low logic state.

For example, assume the voltage at a first node 122 of the cell 100 (e.g., cell 318) in a first row 308 and first column 310 is of a low logic state, and therefore, the cell 318 stores data (e.g., a bit) of low logic state. To write data (e.g., new data which may be of a high logic state) to the cell 318, data may be read from all cells 318, 357 in the first column 310 as part of a preliminary read operation. More specifically, a signal 358 on the second word line 128 may be asserted such that the seventh transistor 126 of each cell 318, 357 in the first column 310 is activated.

In this manner the first column 310 may be selected. Because the cell 318 in the first row 308 and first column 310 stores data of a low logic state, the voltage at a second node 124 of the cell 318 is of a high logic state, and therefore, the eighth transistor 132 is also activated. Therefore, the seventh and eighth transistors 126, 132 affect the voltage of the third bit line 130. More specifically, the seventh and eighth transistors 126, 132 may cause the voltage of the third bit line 130, which initially was charged to a high logic state, to change to a low logic state. Such signal may be provided to the evaluation logic 306 coupled to the cell 318 in the first column 310 and first row 308 as input. The signal of a low logic state input by the first evaluation logic 306 causes the voltage on the global bit line 312 coupled thereto, which initially was charged to a high logic state to change to a low logic state. Such voltage may be provided to the first input 317 of the data input/output logic 304.

In a similar manner, a remaining cell 357 in the selected column 310 may output data stored in the cell 357 to evaluation logic (e.g., second evaluation logic (not shown)) coupled thereto which may affect the voltage of the third bit line 130 coupled the remaining cell 357. For example, assume the voltage at the first node 122 of a cell in a second row 309 and first column 310 (e.g., the remaining cell 357) is of a high logic state, and therefore, the remaining cell 357 stores data (e.g., a bit) of high logic state. As stated, the signal asserted on the second word line 128 activates the seventh transistor 126 of the remaining cell 357. Further, because the remaining cell 357 stores data of a high logic state, the voltage at the second node 124 of the remaining cell 357 is of a low logic state, and therefore, the eighth transistor 132 of the remaining cell 357 is not activated. Consequently, the seventh and eighth transistors 126, 132 of the remaining cell 357 may not affect the voltage of the third bit line 130 coupled to the remaining cell 357. More specifically, the voltage of the third bit line 130, which initially was charged to a high logic state, may remain at the high logic state. Such signal may be provided to the evaluation logic 306 (e.g., second evaluation logic) coupled to the remaining cell 357 as input. The signal of a high logic state input by the second evaluation logic may not affect the voltage on the global bit line 312 coupled thereto, which initially was charge to a high logic state. More specifically, because a signal of a high logic state is input by the evaluation logic, the voltage on the global bit line coupled to the remaining cell 357 remains of a high voltage state. Such voltage may be provided to the second input 319 of the data input/output logic 304.

The data (e.g., of a low logic state) input by the first input 317 of the data input/output logic 304 may be stored in the first latching structure 322, and thereafter, launched from the first latching structure 322 and provided to the first input 336 of the second multiplexer 334. Similarly, the data (e.g., of a high logic state) input by the second input 319 of the data input/output logic 304 may be stored in the second latching structure 328, and thereafter, launched from the second latching structure 328 and provided to the first input 348 of the third multiplexer 346. In this manner, a read (e.g., preliminary read) may be performed on all cells 318, 357 included in the selected column 310 before data is written to the cell 318 to be written.

Data launched from the first latching structure 322 may also be provided to the first input 325 of the first multiplexer 326, and data launched from the second latching structure 328 may be provided to the second input 330 of the first multiplexer 326. The first multiplexer 326 may be employed during a read operation (e.g., in contrast to a preliminary read operation performed as part of a write operation) which is described below.

As stated, data (e.g., new data) input by the third input 320 of the data input/output logic 304 may be provided to the second inputs 342, 350 of the second and third multiplexers 334, 346, respectively.

In step 406, new data may be written to the cell 318 to be written. To write data (e.g., new data) to the cell 318 to be written, a control signal (e.g., BSW0) may be applied to the third input 344 of the second multiplexer 334 such that the second multiplexer 334 outputs the new data. Consequently, a signal of the same state as the new data may be asserted on the first bit line 112 coupled the cell 318 and a signal of the opposite state of the new data may be asserted on the second bit line 120 coupled to the cell 318.

Similarly, a control signal (e.g., BSW1) may be applied to the third input 352 of the third multiplexer 346 such that the third multiplexer 346 outputs data that is preliminarily read from the remaining cell 357 and input by the first input 348 of the third multiplexer 346. Consequently, a signal of the same state as the data preliminarily read from the remaining cell 357 may be asserted on the first bit line 112 coupled the remaining cell 357 and a signal of the opposite state of the data preliminarily read from the remaining cell 357 may be asserted on the second bit line 120 coupled to the remaining cell 357.

Further, a signal 360 (e.g., of a high logic state) may be asserted on the first word line 110. Asserting a signal on the first word line 110 may activate the first and second transistors 108, 118 of each cell 318, 357 in the selected column 310. Consequently, the voltage of the first node 122 of the cell 318 may be updated (e.g., from a low logic state to a high logic state) based on the state of the signals on the first and second bit lines 112, 120 coupled thereto. In this manner, data (e.g., new data) is written to the cell 318.

In step 408, stress adapted to change a value stored in a remaining cell 357 in the selected column 310 is reduced while writing data to the cell 318 to be written. Similar to the cell 318 to be written, asserting the signal on the first word line 110 may cause the value stored in the remaining cell 357 to be updated (e.g., to the same value) based on the state of the signals on the first and second bit lines 112, 120 coupled thereto. In this manner, while writing data (e.g., new data) to the cell 318 to be written, any remaining cells 357 in the same column 310 as the cell 318 to be written may also be written to (e.g., with the same respective values currently stored in such remaining cells 357. By writing data to a remaining cell 357 while writing data (e.g., new data) to the cell 100 to be written, the remaining cell 357 may not be forced to maintain a stored value and affect the voltage of a first or second bit line 112, 120 coupled thereto as in some conventional memories. Forcing a cell to maintain a stored value and affect the voltage of a first or second bit line 112, 120 coupled thereto while data is written into the cell 100 to be written may place stress on the cell. Such stress may be adapted to change a value stored the cell. More specifically, such stress may cause the value of the voltage at the first or second node 122, 124 to rise such that value stored by the cell changes state. In this manner, the present methods and apparatus may reduce and/or prevent such stress.

In step 410, the method 400 ends. Through use of the present methods and apparatus data (e.g., data of a new value) may be written to a cell 318 in a column 310 of memory 302 by preliminarily reading data from each cell 318, 357 in the column 310 during a first time period, such as a first portion of a cycle, and writing the data (e.g., data of a new value) to the cell 318 and writing the respective data read from any remaining cells 357 in the column 310 back into such remaining cells 357, respectively, during a second time period, such as a second portion of the cycle. In this manner, a write operation of the present methods and apparatus may include reading data from all cells 318, 357 in a column 310 followed by writing data to all cells 318, 357 in the column 310. More specifically, data may be read from a fully selected cell 318 (e.g., a cell in the column selected by a word line and a row selected by bit lines coupled to the cell) and from ½ selected cells 357 (e.g., a cell in the column selected by the word line but in a row unselected by bit lines coupled to the cell). The data input by the third input 320 of the data input/output logic 304 may be written to the cell 318 to be written in the selected column 310, thereby modifying the cell 100, and data previously read from a remaining cell 357 in the selected column 310 is written back to the remaining cell 357. Therefore, new data may be driven into the fully selected cell 318, and data previously read from a ½ selected cell may be driven back into such cell 357. Consequently, no cells 318, 357 in the selected column 310 undergo a stress of having to maintain a stored value while affecting a state of a bit line coupled thereto. In this manner, a write operation may include read, modify and write steps performed during a cycle such that the read, modify, and write steps are transparent to logic external to the memory system 300.

Similarly, a read operation may be performed on the memory system 300 such that stress adapted to change a value stored in a cell 318, 357 does not form on any cells 318, 357 during the read operation. For example, the method 300 may be employed to read data from one or more cells 318, 357 of the memory system 300. The read operation is similar to the preliminary read operation performed as part of the write operation described above. For example, a signal 362 on the second word line 128 may be asserted such that the seventh transistor 126 of each cell 318, 357 in the first column 310 is activated. However, in contrast to the preliminary read operation performed as part of the write operation, during the read operation, control signals BSR0 and/or BSR1 may be provided such that the first multiplexer 326 outputs data input by the first input 325 (e.g., data read from the cell 318) or data input by the second input 330 (e.g., data read from the remaining cell 357). An output 364 of the first multiplexer 326 may serve as an output of the memory system 300. Similar to the preliminary read operation, for example, while reading data from a cell 100 (e.g., cell 318) as part of a read operation, a control signal BSW0 may be applied to the second multiplexer 334 such that data input by the first input 336 of the second multiplexer 334 may be output by the second multiplexer 334. The output of the second multiplexer 334 may affect values of the first and second bit lines 112, 120 coupled to the cell 318. Through use of a plurality of the memory cells 100 of FIG. 1 in the memory 302, a value of data stored in a cell 318, 357 by a first group of transistors may be prevented from changing state while the second group of transistors 106 affects the signal asserted during the read operation on a bit line 130 coupled to the cell 318, 357. In this manner, the present methods and apparatus may reduce and/or prevent stress that forms in one or more cells 318, 357 of the memory 302 as respective data is read from such cells 318, 357 during a read operation.

Figure 5:
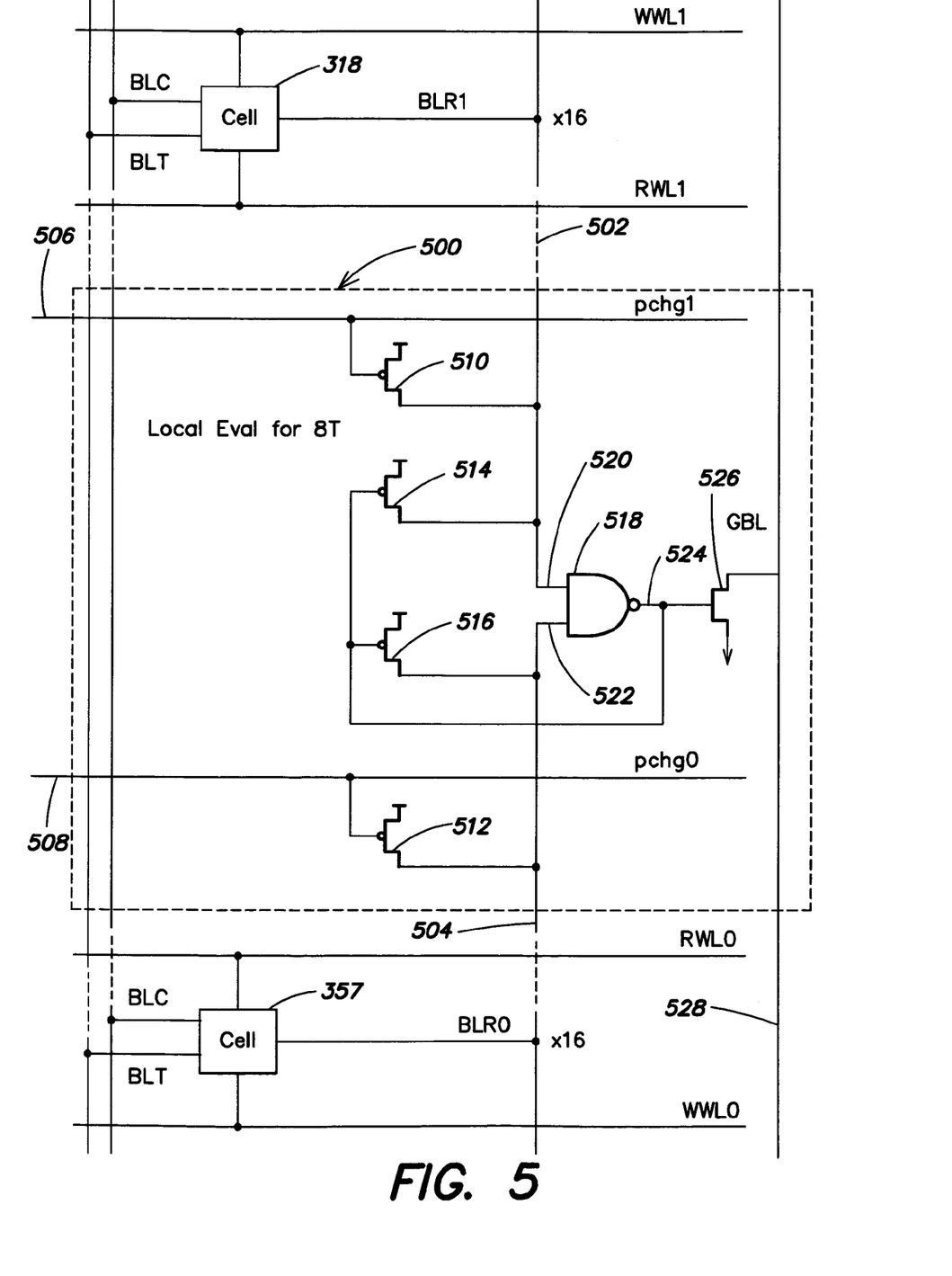
FIG. 5 is a block diagram of alternative evaluation logic in accordance with an embodiment of the present invention.
Figure 6:
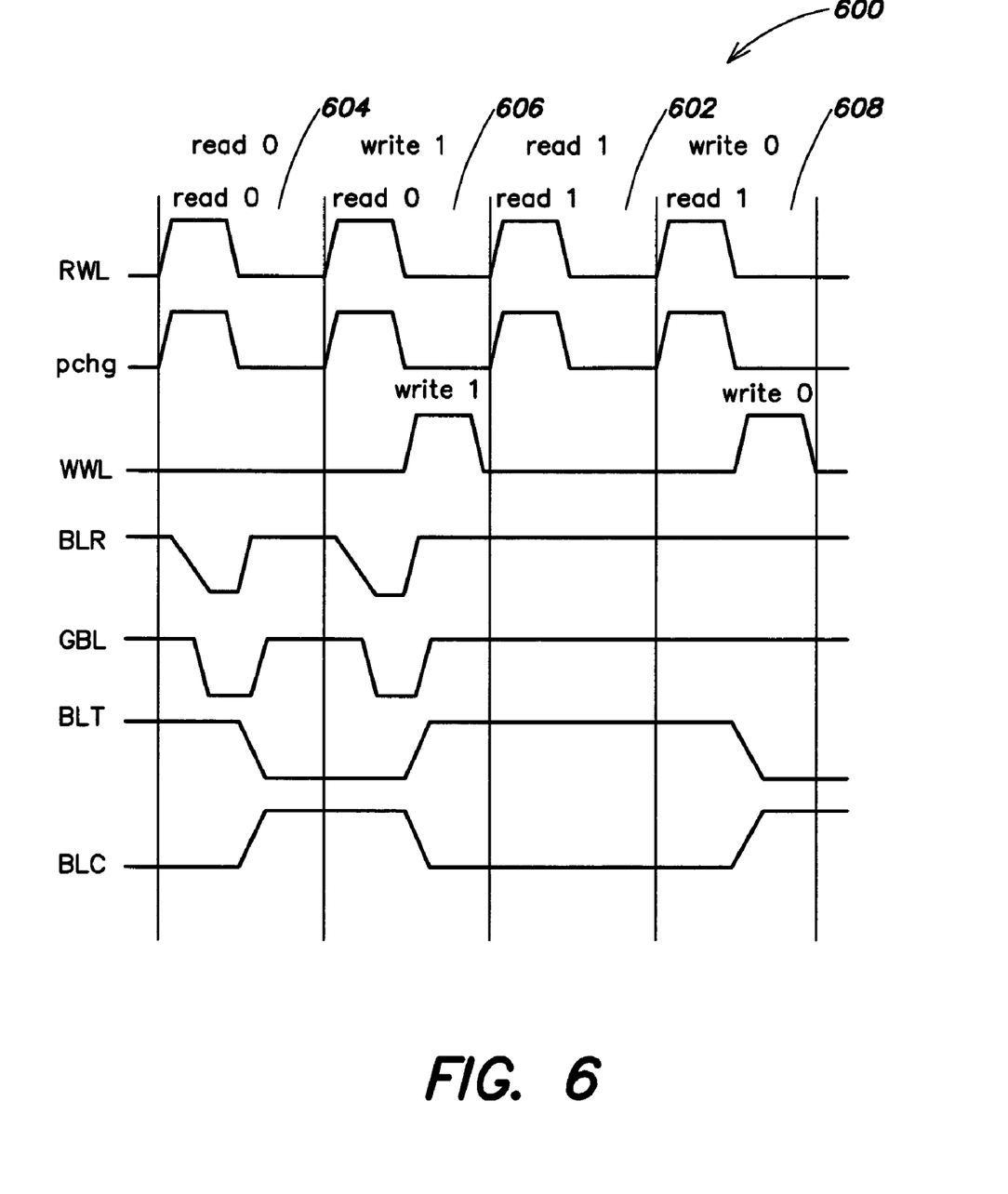
FIG. 6 is a detailed timing diagram illustrating signals applied to the memory system in accordance with an embodiment of the present invention.

FIG. 5 is a block diagram of alternative evaluation logic 500 in accordance with an embodiment of the present invention and FIG. 6 is a detailed timing diagram 600 illustrating signals applied to the memory system in accordance with an embodiment of the present invention. With reference to FIGS. 5 and 6, the alternative evaluation logic 500 may be coupled to two groups of cells. Although the evaluation logic 500 is shown coupled to the cell 318 and the remaining cell 357, it should be understood that the cell 318 may represent a plurality of cells included in a first group. For example, the first group may include sixteen cells (although a larger or smaller number of cells may be employed). Similarly, the remaining cell 357 may represent a plurality of cells included in a second group, which includes sixteen cells (although a larger or smaller number of cells may be employed). The first group and second group of cells may be coupled to respective third bit lines BLR1, BLR0. Additionally, individual cells of the memory system may be coupled to respective first word lines (e.g., WWL1, WWL0) and second word lines (e.g., RWL1, RWL0).

A first input 502 of the alternative evaluation logic 500 may be coupled to the third bit line BLR1 coupled to the cell 318. A second input 504 of the alternative evaluation logic 500 may be coupled to the third bit line BLR0 coupled to the cell 357. Further, a third input 506 of the alternative evaluation logic 500 may be coupled to a first pre-charge line pchg1 adapted to cause an initial value to be asserted on a line (e.g., the third bit line BLR1 coupled to cell 318). Similarly, a fourth input 508 of the alternative evaluation logic 500 may be coupled to a second pre-charge line pchg0 adapted to cause an initial value to be asserted on a line (e.g., the third bit line BLR0 coupled to the cell 357).

Further, the alternative evaluation logic 500 may include a first transistor 510 (e.g., a PFET) coupled (e.g., via a gate terminal) to the first pre-charge line pchg1 such that the first pre-charge line pchg1 may serve to activate the first transistor 510. The first transistor 510 may be coupled to a high logic state (e.g., via a drain or source terminal) and the third bit line BLR1 coupled to cell 318 (e.g., via a source or drain terminal). Similarly, the alternative evaluation logic 500 may include a second transistor 512 (e.g., a PFET) coupled (e.g., via a gate terminal) to the second pre-charge line pchg0 such that the second pre-charge line pchg0 may serve to activate the second transistor 512. The second transistor 512 may be coupled to a high logic state (e.g., via a drain or source terminal) and the third bit line BLR0 coupled to cell 357 (e.g., via a source or drain terminal).

Additionally, the alternative evaluation logic 500 may include a third transistor 514 (e.g., a PFET) coupled to a high logic state (e.g., via a drain or source terminal) and the third bit line BLR1 coupled to cell 318 (e.g., via a source or drain terminal). The third transistor 514 may charge the third bit line BLR1 coupled to cell 318. Similarly, the alternative evaluation logic 500 may include a fourth transistor 516 (e.g., a PFET) coupled to a high logic state (e.g., via a drain or source terminal) and the third bit line BLR0 coupled to cell 357 (e.g., via a source or drain terminal). The fourth transistor 516 may charge the third bit line BLR0 coupled to cell 357.

The alternative evaluation logic 500 may include logic 518, such as NANDing logic, a first input 520 of which may be coupled to the third bit line BLR1 coupled to cell 318 and a second input 522 of which may be coupled to the third bit line BLR0 coupled to cell 357. An output 524 of the logic 518 may be coupled to the third and fourth transistors 514, 516 (e.g., via respective gate terminals of such transistors). Further, the output 524 of the logic 518 may couple to a fifth transistor 526 (e.g., to a gate terminal of the fifth transistor 526). The fifth transistor 526 may be coupled to a global bit line GBL (e.g., via a drain or source terminal) and a low logic state (e.g., via a source or drain terminal). The global bit line GBL may serve as an output 528 of the alternative evaluation logic 500.

The alternative evaluation logic 500 primarily may be used for a read operation. Further, as described above, the alternative evaluation logic 500 may be employed to cause an initial value to be asserted on a line coupled to a cell 318, 357 of the memory system 300. For example, the alternative evaluation logic 500 may assert signals of a high logic state on the third bit lines BLR1, BLR0 coupled to cells 318, 357, respectively. In operation, two read ports may provide input to the alternative evaluation logic 500. During a read opera-
tion one of the cells 318, 357 will be activated. For example, assume cell 318 is activated during the read operation. More specifically, assume a signal on the second word line RWL1 coupled to the cell 318 is asserted. It should be understood that the signal lines of the detailed timing diagram 600 of FIG. 6 correspond to signal lines coupled to a cell to be written or read. For example, if cell 318 is to be written or read, signal lines RWL, pchg, WWL, BLR, BLT and BLC correspond to signal lines RWL1, pchg1, WWL1, BLR1, BLT and BLC coupled to the cell 318, respectively. As illustrated in the detailed timing diagram 600, a signal on the second word line RWL1 coupled to cell 318 may be asserted at the same time as a signal on a pre-charge line pchg corresponding to the second word line RWL1 of the first group (e.g., the first pre-charge line pchg1) is asserted. However, signals may not be asserted (e.g., will remain low) on read word lines going to remaining cells in the first group coupled to the third bit line BLR1 and cells in the second group coupled to the third bit line BLR0. Also, a signal may not be asserted on the pre-charge line pchg0 corresponding to the second word line RWL0 of the second group.

When the signal on the second word line RWL1 coupled to cell 318 is asserted, a first read device (e.g., the seventh transistor 126) in the cell 318 may be activated. Further, depending upon a value of data stored in the cell 318, a second read device (e.g., the eighth transistor 132) coupled to the first read device may or may not be activated. If not activated, for example when the cell 318 stores a value of a high logic state, the signal asserted on the third bit line BLR1 will remain asserted (e.g., at its pre-charged value). Consequently, the downstream circuits (e.g., remaining cells in the first group) may not change state. Further, when this happens, because the first input 520 of the logic (e.g., NANDing logic) 518 is coupled to the third bit line BLR1 of cell 318 and the second input 522 is coupled to the third bit line BLR0 of cell 357, which was pre-charged to a value of a high logic state, a value output by the logic 518 (e.g., via output 524) may not change state. Consequently, the fifth transistor (e.g., an NFET) may remain not activated, and a signal asserted on the global bit line GBL, which may have been pre-charged to a high logic state, may remain of the high logic state. Therefore, the global bit line GBL may track a value stored in the cell 318. In this manner, a value of a high logic state (e.g., a logic "1") may be read from the cell 318. A first portion 602 of the timing diagram 600 illustrates exemplary signals employed for such read operation (although a different combination of signals may be employed).

Alternatively, if the second read device is activated, for example, when the cell 318 stores a value of a low logic state, because a signal is asserted on the second word line RWL1, the signal on the third bit line BLR1 coupled to cell 318 may change (e.g., be pulled) to a low logic state. When this happens, because the first input 520 of the logic (e.g., NANDing logic) 518 is coupled to the third bit line BLR1, a value output by the logic 518 (e.g., via output 524) may change state. Consequently, the fifth transistor 518 may be activated, and thereby change (e.g., pull down) a signal asserted on the global bit line GBL, which may have been pre-charged to a high logic state, to a low logic state. Therefore, the global bit line GBL may track a value stored in the cell 318. In this manner, a value of a low logic state (e.g., a logic "0") may be read from the cell 318. A second portion 604 of the timing diagram 600 illustrates exemplary signals employed for such read operation (although a different combination of signals may be employed). Additionally, a third portion 606 of the detailed timing diagram 600 illustrates exemplary signals employed to perform an operation in accordance with an embodiment of the present methods and apparatus to write a value of a high logic state to the cell 318 (although a different combination of signals may be employed). Similarly, a fourth portion 608 of the timing diagram 600 illustrates exemplary signals employed to perform an operation in accordance with an embodiment of the present methods and apparatus to write a value of a low logic state to the cell 318 (although a different combination of signals may be employed).

A read or write operation may be performed on the cell 357 in a similar manner. Therefore, details of such operations on the cell 357 are not described in detail herein.

The foregoing description discloses only exemplary embodiments of the invention. Modifications of the above disclosed apparatus and methods which fall within the scope of the invention will be readily apparent to those of ordinary skill in the art. For instance, although cells 318, 357 of the memory 302 are shown in a domino arrangement, in some embodiments, the cells 318, 357 may be arranged differently. By employing the cell 100 of FIG. 1 in the memory 302 of FIG. 3A, row and column decoding may be employed to fully select a cell 100 in the memory 302 from which data is to be read or to which data is to be written. Data may be written to or read from a fully-selected cell 318 in the memory 302 without causing stress to any cell in the memory that may cause such cell to inadvertently change state.

Accordingly, while the present invention has been disclosed in connection with exemplary embodiments thereof, it should be understood that other embodiments may fall within the spirit and scope of the invention, as defined by the following claims.

The invention claimed is:

1. A method of accessing memory, comprising:
   storing a bit in a cell included in a memory having a plurality of cells arranged into rows and columns, wherein each cell includes a first group of transistors adapted to store the bit and a second group of transistors adapted to affect a signal asserted during a read operation on a read bit line coupled to the cell such that the affected signal matches a value of the bit stored in the cell; and
   preventing the value of the bit stored in the cell from changing state while the second group of transistors affects the signal asserted during the read operation on the read bit line coupled to the cell.

2. The method of claim 1 further comprising employing the affected signal as the output of the cell during the read operation.

3. The method of claim 1 further comprising:
   asserting a signal on a read word line coupled to a first transistor included in the second group of transistors such that the first transistor is activated;
   if a bit of a first value is stored in the cell, applying a signal of a second value to a second transistor in the second group of transistors such that the second group of transistors changes the signal asserted during the read operation on the read bit line to the first value; and
   if a bit of the second value is stored in the cell, applying a signal of the first value to the second transistor in the second group of transistors such that the second group of transistors does not change the signal asserted during the read operation on the read bit line coupled to the cell to the first value.

4. The method of claim 1 wherein preventing the value of the bit stored in the cell from changing state while the second group of transistors affects the signal asserted during the read operation on the read bit line coupled to the cell includes preventing a voltage at a node formed by the first group of transistors from rising as a consequence of the second group of transistors affecting the signal asserted during the read operation on the read bit line coupled to the cell.

5. A method of accessing memory, comprising:
   selecting a column of a memory having a plurality of cells arranged into rows and columns, wherein the selected column includes a first cell to be written;
   writing new data to the first cell; and
   while writing data to the first cell, refreshing data in a second cell in the selected column;
   wherein writing new data includes:
      during a first time period:
         reading data stored in the first cell; and
         receiving the new data; and
      during a second time period, writing the new data to the first cell; and
   wherein refreshing data includes:
      during the first time period:
         reading data stored in the second cell; and
         during the second time period, writing the data read from the second cell back to the second cell.

6. The method of claim 5 wherein:
   writing new data includes, during the first time period, storing data read from the first cell; and
   refreshing data includes, during the first time period, storing data read from the second cell.

7. A method of accessing memory, comprising:
   selecting a column of a memory having a plurality of cells arranged into rows and columns, wherein the selected column includes a first cell to be written;
   writing new data to the first cell; and
   while writing data to the first cell, refreshing data in a second cell in the selected column;
   wherein refreshing data in the second cell includes preventing the second cell from having to affect a state of a bit line coupled to the second cell while maintaining a value of data stored in the second cell.

8. A memory cell, comprising:
   a first group of transistors; and
   a second group of transistors, coupled to the first group of transistors, and adapted to affect a signal asserted during a read operation on a read bit line coupled to the cell such that the affected signal matches a value of a bit stored in the cell;
   wherein the memory cell is adapted to:
      store a bit in the cell using the first group of transistors; and
      prevent the value of the bit stored in the cell from changing state while the second group of transistors affects the signal asserted during the read operation on the read bit line coupled to the cell.

9. The memory cell of claim 8 wherein the memory cell is further adapted to employ the affected signal as the output of the cell during the read operation.

10. The memory cell of claim 8 wherein the memory cell is further adapted to:
   detect a signal is asserted on a read word line coupled to a first transistor included in the second group of transistors such that the first transistor is activated;
   if a bit of a first value is stored in the cell, apply a signal of a second value to a second transistor in the second group of transistors such that the second group of transistors changes the signal asserted during the read operation on the read bit line to the first value; and if a bit of the second value is stored in the cell, apply a signal of the first value to the second transistor in the second group of transistors such that the second group of transistors does not change the signal asserted during the read operation on the read bit line coupled to the cell to the first value.

11. The memory cell of claim 8 wherein the memory cell is further adapted to prevent a voltage at a node formed by the first group of transistors from rising as a consequence of the second group of transistors affecting the signal asserted during the read operation on the read bit line coupled to the cell.

12. An apparatus, comprising:
a memory having a plurality of the memory cells of claim 9 arranged into rows and columns; and
data input/output logic coupled to the memory and adapted to at least one of input data to and output data from the memory;
wherein the memory is adapted to:
select a column of cells, wherein the selected column includes a first cell to be written;
write new data to the first cell; and
while writing data to the first cell, refresh data in a second cell in the selected column.

13. The apparatus of claim 12 wherein the apparatus is further adapted to:
during a first time period:
read data stored in the first cell; and
receive the new data; and
during a second time period, write the new data to the first cell; and
during the first time period, read data stored in the second cell; and
during the second time period, write the data read from the second cell back to the second cell.

14. The apparatus of claim 13 wherein the apparatus is further adapted to, during the first time period:
store data read from the first cell; and
store data read from the second cell.

15. The apparatus of claim 12 wherein the apparatus is further adapted to prevent the second cell from having to affect a state of a bit line coupled to the second cell while maintaining a value of data stored in the second cell.

16. The apparatus of claim 12 further comprising evaluation logic coupled to a cell and adapted to, while reading data from the cell, affect a signal on a read bit line such that the signal tracks a value stored in the cell.

17. A memory, comprising:
a first memory cell as claimed in claim 8;
a second memory cell as claimed in claim 8 coupled to the first memory cell such that the first and second memory cells form a row; and
a third memory cell as claimed in claim 8 coupled to the first memory cell such that the first and third memory cells form a column.

18. The memory of claim 17 wherein each memory cell is further adapted to employ the affected signal as the output of the cell during the read operation.

19. The memory of claim 17 wherein each memory cell is further adapted to:
detect a signal is asserted on a read word line coupled to a first transistor included in the second group of transistors such that the first transistor is activated;
if a bit of a first value is stored in the cell, apply a signal of a second value to a second transistor in the second group of transistors such that the second group of transistors affects the signal asserted during the read operation on the read bit line to the first value; and
if a bit of the second value is stored in the cell, apply a signal of the first value to the second transistor in the second group of transistors such that the second group of transistors does not affect the signal asserted during the read operation on the read bit line coupled to the cell to the first value.

20. A method of accessing memory, comprising:
selecting a column of a memory having a plurality of cells arranged into rows and columns, wherein the selected column includes a first cell to be written and a second cell;
preliminarily reading data in the first and second cells of the selected column;
after the reading, writing new data to the first cell; and
while writing data to the first cell, refreshing data in the second cell in the selected column using the data previously read from the second cell.

* * * * *